(12) United States Patent
Hung et al.

(10) Patent No.: US 10,284,114 B1
(45) Date of Patent: May 7, 2019

(54) MODULATION METHOD FOR INVERTER AC WAVEFORM

(71) Applicant: PHIHONG TECHNOLOGY CO., LTD., Taoyuan (TW)

(72) Inventors: Ming Huang Hung, Taoyuan (TW); Jiun-Ping Huang, Taoyuan (TW); Po-Chi Hung, Taoyuan (TW); Mu Hsun Chen, Taoyuan (TW)

(73) Assignee: PHIHONG TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 16/147,452

(22) Filed: Sep. 28, 2018

(30) Foreign Application Priority Data

Aug. 27, 2018 (TW) .................................. 107129878

(51) Int. Cl.
*H02M 7/5395* (2006.01)
*H03K 7/08* (2006.01)
*H02M 7/539* (2006.01)

(52) U.S. Cl.
CPC ............ *H02M 7/5395* (2013.01); *H03K 7/08* (2013.01); *H02M 7/539* (2013.01)

(58) Field of Classification Search
CPC .......................... H02M 7/539; H02M 7/5395
USPC ....................... 363/40–42, 98, 132
See application file for complete search history.

(56) References Cited

U.S. PATENT DOCUMENTS

| 2012/0033469 | A1* | 2/2012 | Mohr | ................ | H02M 3/33569 |
| | | | | | 363/98 |
| 2014/0369089 | A1* | 12/2014 | Sakakibara | ......... | H02M 5/4585 |
| | | | | | 363/37 |
| 2015/0188453 | A1* | 7/2015 | Damson | ............ | H02M 7/53875 |
| | | | | | 318/504 |
| 2015/0194909 | A1* | 7/2015 | Pahlevaninezhad | ........................ | |
| | | | | | H02M 7/5387 |
| | | | | | 363/132 |
| 2016/0211790 | A1* | 7/2016 | Ajima | ................. | B60L 11/1803 |
| 2016/0315558 | A1* | 10/2016 | Lee | ........................ | H02M 7/537 |

* cited by examiner

*Primary Examiner* — Gary A Nash
(74) *Attorney, Agent, or Firm* — Chih Feng Yeh; Huntington IP Consulting Co., Ltd.

(57) ABSTRACT

The present invention discloses a modulation method for inverter AC waveform. The detailed steps of the modulation method comprise: generating an AC waveform which includes at least three time periods, wherein a middle time period corresponds to a peak segment of the AC waveform, and the remaining time periods are averaged corresponding to the rise and decline segments of the AC waveform; and during the at least three time periods, a duty ratio modulated driving signal is generated according to different duty ratios, so as to modulate the AC waveform and generate a stepping AC waveform converted from the AC waveform. The stepping AC waveform generated by the modulation method of the present invention will have a longer dwell time at zero potential, so as to turn on the AC electric tool more efficiently.

15 Claims, 7 Drawing Sheets

MODULATION METHOD FOR INVERTER AC WAVEFORM

CROSS-REFERENCE TO RELATED APPLICATION

The present patent application claims the benefit of TAIWAN Patent Application Serial Number 107129818 filed on Aug. 27, 2018, which is herein incorporated by reference in its' entirety.

BACKGROUND

Technical Field

The present patent application relates to a modulation technology for AC waveform, and particularly to a method for modulating AC inputted waveform of the inverter of electric tools.

Related Arts

Electric tools may be classified into DC electric motor and AC electric motor because the inputted current is different. As the name implies, the AC electric motor utilizes the AC input to drive the electric motor. There are various kinds of AC electric motors, which are mainly classified into commutator motors, induction motors and synchronous motors. These AC electric motors all have one characteristic that they are very sensitive to zero voltage detection of the AC input, such that only extremely accurate AC inputted waveform can pass the detection. In other words, if the zero-crossing point of the AC input is not smooth enough, the AC electric tool such as DEWALT AC electric tool cannot be activated successfully.

The AC input needed by the electric tools is usually generated by the inverters. The conventional inverters are based on hardware and software and generate the AC output via specific pulse width modulation (PWM) method. According to different forms, the AC output waveform thereof may be classified into square wave (SW), true sine wave (TSW) and modified sine wave (MSW), which are illustrated in sequence in FIG. 1. Theoretically, the inverter employed to generate true sine wave AC output is considered the best because the AC circuit power is usually true sine wave. However, the production cost for the inverter employed to generate true sine wave output is higher since these inverters often utilize expensive low frequency transformer and the total weight thereof is heavier.

Based on the aforementioned, although the true sine wave AC output is one option for the AC input needed by the electric tool, the inverter employed to generate true sine wave AC output utilizes more expensive low frequency transformer in comparison to the inverter utilized to generate modified sine wave AC output, apparently resulting in the disadvantage of high cost. Therefore, the problem to be solved in the present invention is how to improve the topological structure of the inverter used to generate modified sine wave to render the AC output waveform of the inverter to have longer dwell time at zero potential and to provide more accurate AC inputted waveform of the electric tool, so as to for example successfully activate the DEWALT AC electric tool.

SUMMARY

One object of the present invention is to provide a modulation method for AC waveform of an inverter. The generated AC output waveforms have longer dwell times at zero potential. The modulation process does not need expensive low frequency transformer and only requires a simple microprocessor, such that the AC electric tool may be activated more efficiently.

In order to achieve the aforementioned objects, in a first embodiment, a modulation method for the AC waveform of the inverter provided by the present invention, including the following steps: generating an AC waveform including a former time period, a middle time period and a latter time period, wherein the middle time period corresponds to a peak segment of the AC waveform, the former time period and the latter time period corresponding to a rise segment and a decline segment of the AC waveform respectively; and during the former time period, the middle time period and the latter time period, a duty ratio modulated driving signal is generated according to a former duty ratio, a middle duty ratio and a latter duty ratio respectively to modulate the AC waveform and generate a stepping AC waveform converted from the AC waveform, wherein the stepping AC waveform is inputted into an AC electric tool. The former duty ratio, the middle duty ratio and the latter duty ratio correspondingly modulate the AC waveforms in the former time period, the middle time period and the latter time period respectively.

Preferably, in the first embodiment, the former time period may be equal to the latter time period, and the middle time period may be 2~5 times the former time period or the latter time period; or the former time period may be greater or smaller than the latter time period, and the middle time period may be 2~5 times the former time period or the latter time period. Preferably, the former duty ratio, the middle duty ratio and the latter duty ratio may be about 25%~75%, 100%, and 25%~75% of the inputted voltage, respectively.

In order to achieve the aforementioned objects, in a second embodiment of the modulation method for the AC waveform of the inverter provided by the present invention, preferably, the former time period may be further classified into a first former time period and a second former time period in sequence, and the latter time period may be further classified into a first latter time period and a second latter time period in sequence; during the first former time period, the second former time period, the first latter time period and the second latter time period, the duty ratio modulated driving signal may be generated according to a first former duty ratio, a second former duty ratio, a first latter duty ratio and a second latter duty ratio to modulate the AC waveform and generate a stepping AC waveform converted from the AC waveform. The stepping AC waveform may be inputted into an AC electric tool; the first former duty ratio, the second former duty ratio, the first latter duty ratio and the second latter duty ratio correspondingly modulate the AC waveforms in the first former time period, the second former time period, the first latter time period and the second latter time period respectively.

In the second embodiment, preferably, the first former time period may be equal to the second former time period, the first latter time period and the second latter time period, and the middle time period may be 4~10 times the first former time period, the second former time period, the first latter time period or the second latter time period; or the first former time period may be greater than the second former time period, the first latter time period may be smaller than the second latter time period, and the middle time period may be 4~10 times the first former time period, the second former time period, the first latter time period or the second latter time period. Preferably, the first former duty ratio, the second former duty ratio, the middle duty ratio, the first latter duty ratio and the second latter duty ratio may be about 20%~30%, about 70%~80%, about 100%, about 70%~80% and about 20%~30% of the inputted voltage, respectively.

BRIEF DESCRIPTION OF THE DRAWINGS

The present invention may be understood by some preferred embodiments and detailed descriptions in the specification and the attached drawings below. However, it should be appreciated that the preferred embodiments of the present invention are only for illustrating the present invention, not for limiting the claims of present invention.

DETAILED DESCRIPTION

The present invention will now be described with the preferred embodiments and aspects and these descriptions interpret structure and procedures of the present invention only for illustrating but not for limiting the Claims of the present invention. Therefore, except the preferred embodiments in the specification, the present invention may also be widely used in other embodiments.

Figure 3:
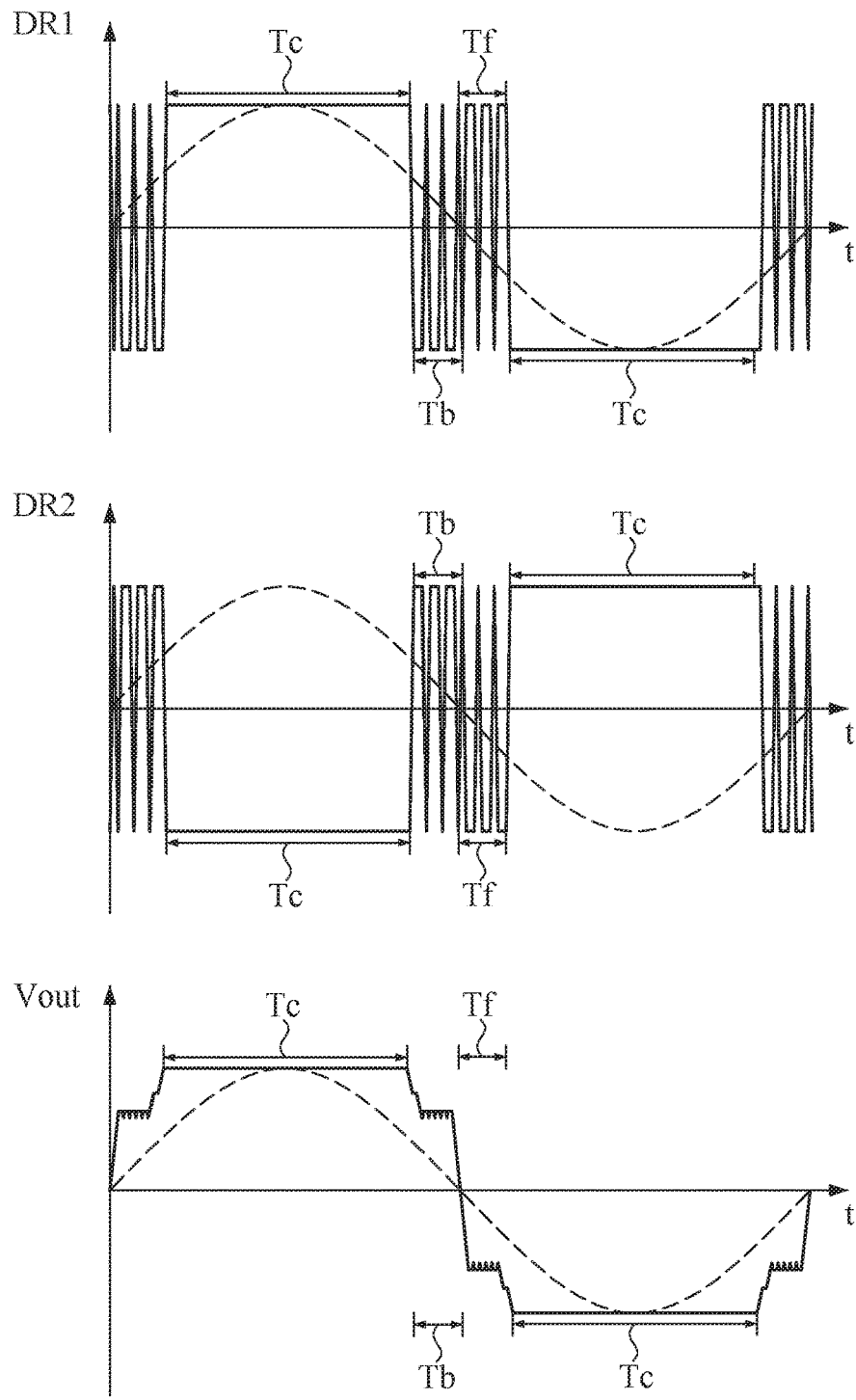
FIG. 3 illustrates modulation driving signals and AC output waveforms of the first embodiment of the present invention.

Please refer to FIG. 3, which illustrates modulation driving signals and AC output waveforms of the first embodiment of the present invention. As shown in FIG. 3, the first embodiment of the present invention employs two modulation driving signals DR1 and DR2 generated by a microprocessor (not shown). The modulation driving signals DR1 and DR2 are shown in the upper two diagrams of FIG. 3 respectively and belong to modulation signals via the single polar modulation method. The modulation driving signals DR1 and DR2 are designed to operate inversely to each other. That is to say, when the modulation driving signal DR1 is positive, the modulation driving signal DR2 is negative; when the modulation driving signal DR1 is negative, the modulation driving signal DR2 is positive, so as to generate the AC output waveform having positive and negative values switching in a cycle.

In the first embodiment of the present invention, any half cycle of the modulation driving signals DR1 and DR2 is a former time period Tf, a middle time period Tc and a latter time period Tb in sequence, which are configured according to the AC waveform to be modulated. Specifically, the middle time period Tc corresponds to the peak segment of the AC waveform, and the former time period Tf and the latter time period Tb correspond to the rise segment and the decline segment of the AC waveform respectively. In one embodiment, the rise segment and the decline segment may include two-stage step waveforms respectively. It should be noted that although the AC waveform and the modulation driving signals DR1 and DR2 all have positive and negative half cycles, the configuration of the three time periods may be applied similarly. In other words, it may be applied that at negative half cycle, the former time period Tf corresponding to the rise segment of the AC waveform is toward the negative direction while the latter time period Tb corresponding to the decline segment of the AC waveform is toward the positive direction.

Preferably, in the first embodiment of the present invention, the former time period Tf is equal to the latter time period Tb, and the middle time period Tc is 2~5 times the former time period Tf or the latter time period Tb. However, the former time period Tf may also be greater or smaller than the latter time period Tb. The first embodiment of the present invention is not limited thereto. The peak segment of the AC output waveform will have enough dwell time because the middle time period Tc is 2~5 times the former time period Tf or the latter time period Tb. In the same way, there will be enough switch time between the positive peak segment and the negative peak segment of the AC output waveform (i.e. having longer dwell time at zero potential) or the AC output waveform will have smoother zero-crossing point at this time period so as to be easily detected (but the detection of the peak segment is not affected) because the former time period Tf and the latter time period Tb are configured before and after the middle time period Tc respectively, and the middle time period Tc is 2~5 times the former time period Tf or the latter time period Tb.

In the first embodiment of the present invention, a duty ratio modulated driving signal is generated during the former time period Tf, the middle time period Tc and the latter time period Tb according to a former duty ratio, a middle duty ratio and a latter duty ratio respectively to modulate the AC waveform and generate a stepping AC waveform converted from the AC waveform, i.e. the AC output waveform. In the first embodiment of the present invention, the former duty ratio, the middle duty ratio and the latter duty ratio correspondingly modulate the AC waveforms during the former time period Tf, the middle time period Tc and the latter time period Tb respectively. Preferably, in the first embodiment of the present invention, the former duty ratio, the middle duty ratio and the latter duty ratio are about 25%~75%, about 100% and about 25%~75% of the inputted voltage, respectively. More preferably, it is more desirable that the former duty ratio and the latter duty ratio is closer to 25% because the switching between the positive and negative peak segments may be further smoothed and the detection of the zero potential is advantaged.

Figure 1:
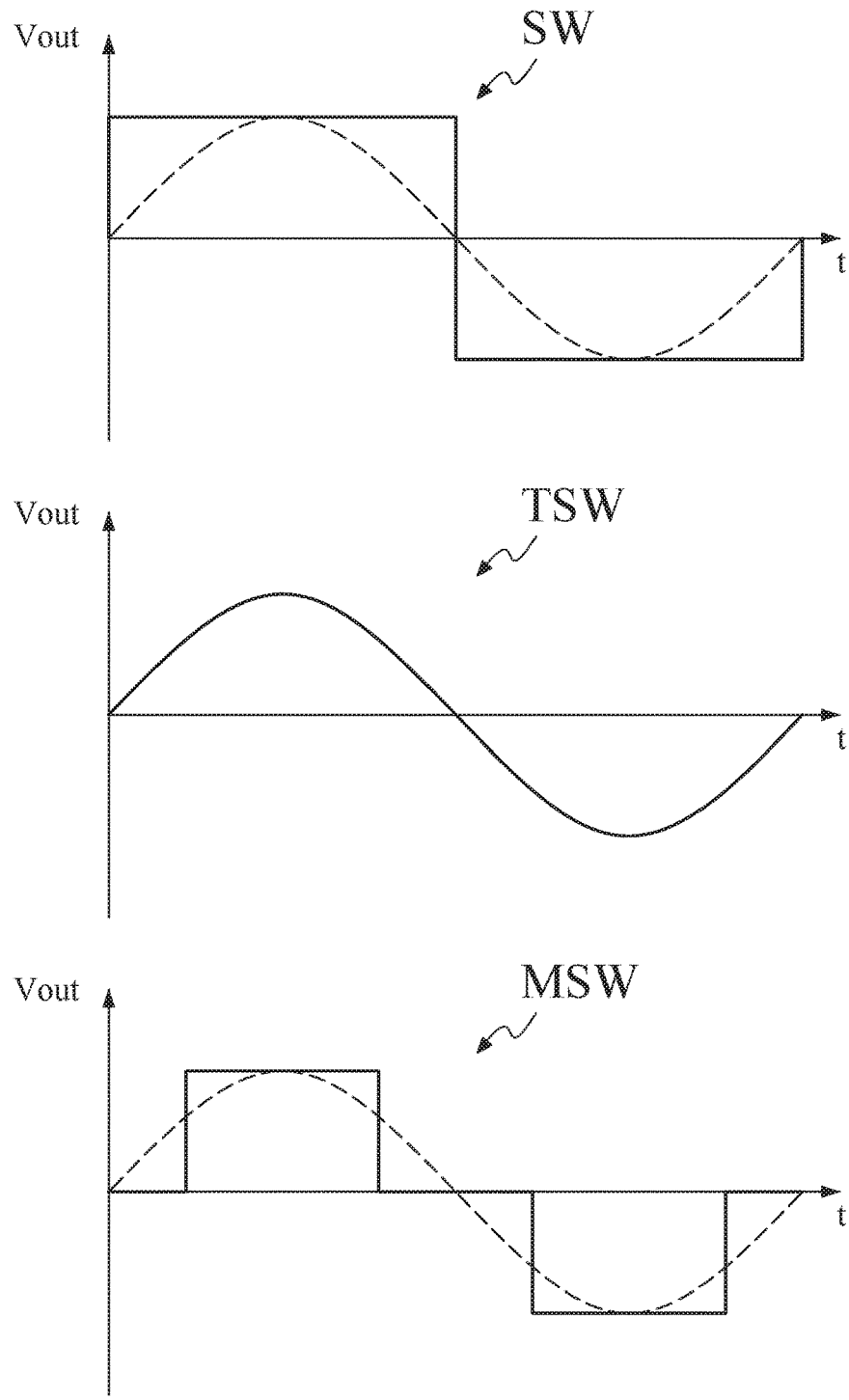
FIG. 1 illustrates three conventional AC output waveforms.
Figure 2:
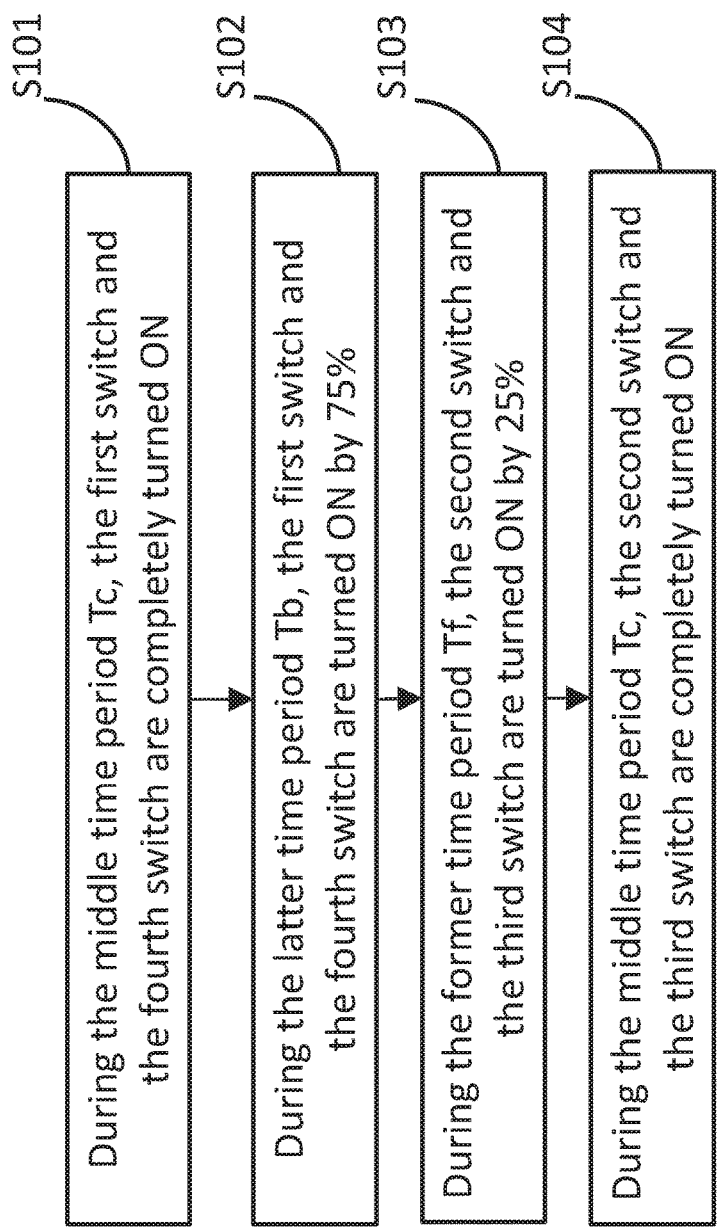
FIG. 2 illustrates operational procedures of a first embodiment of the present invention.
Figure 4:
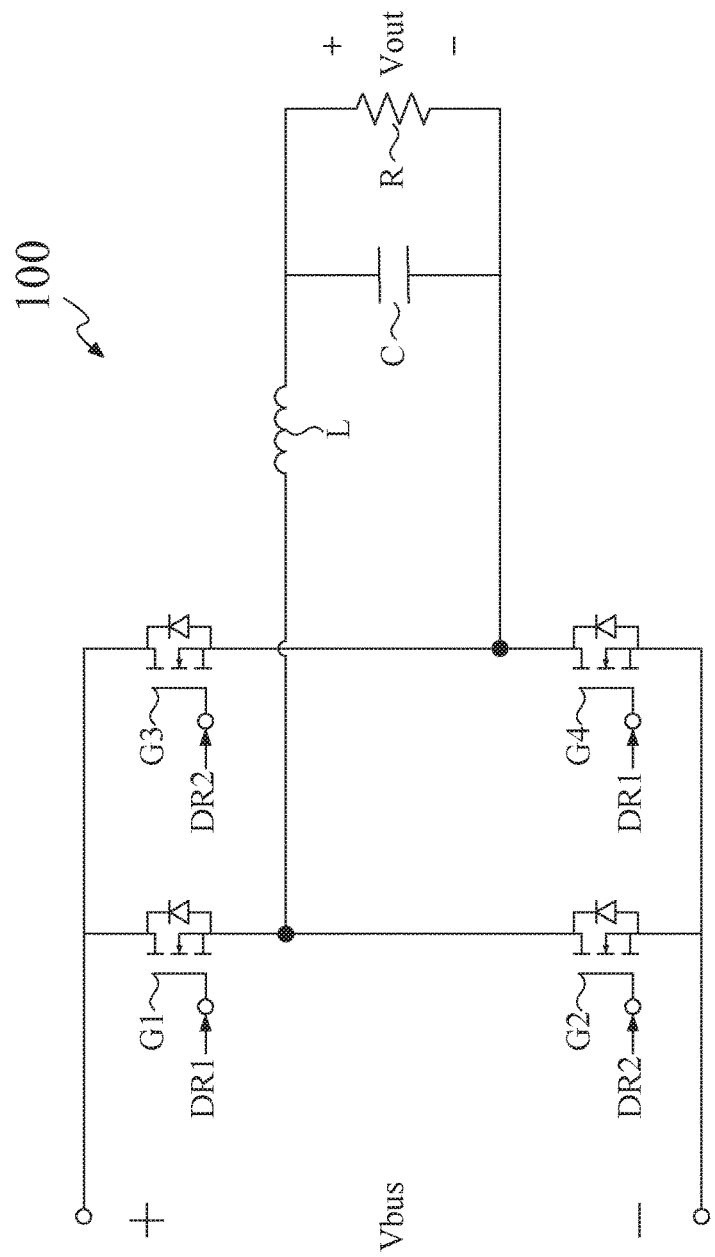
FIG. 4 illustrates an inverter circuit of the first embodiment of the present invention.
Figure 5:
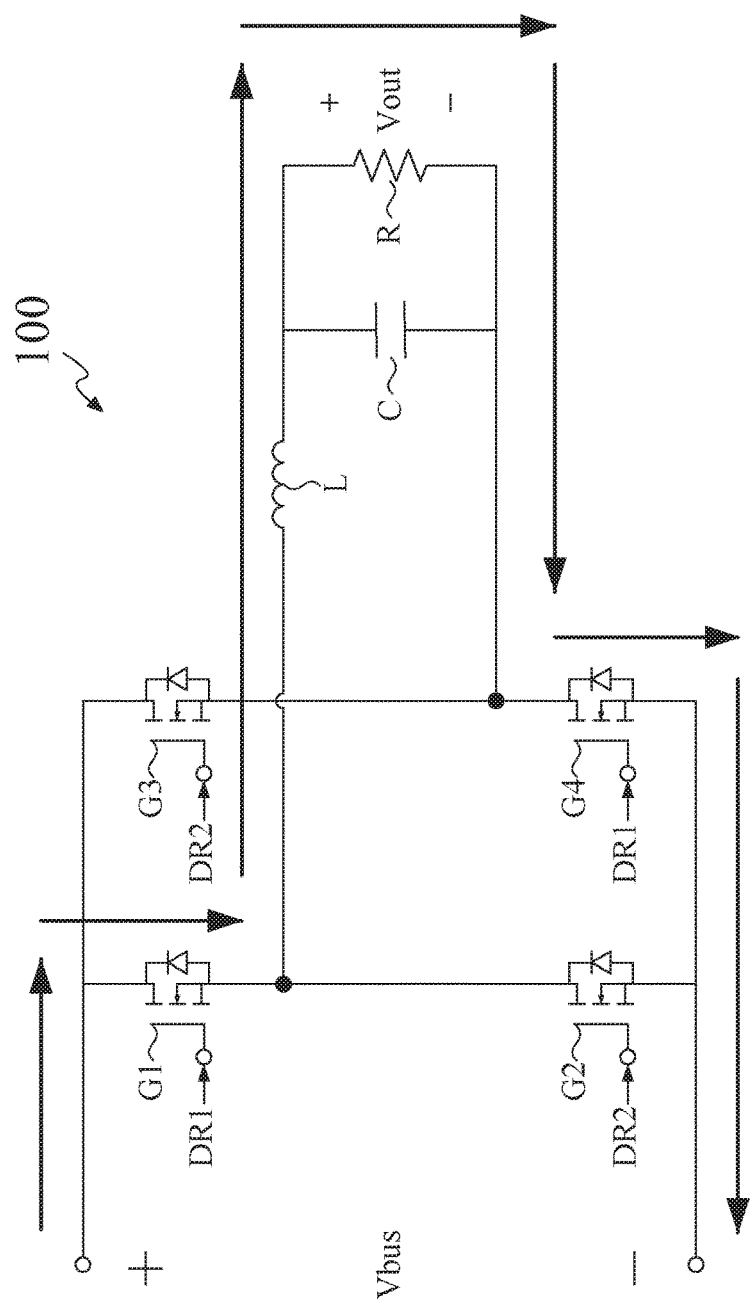
FIG. 5 illustrates the forward operation of the inverter circuit of the first embodiment of the present invention.
Figure 6:
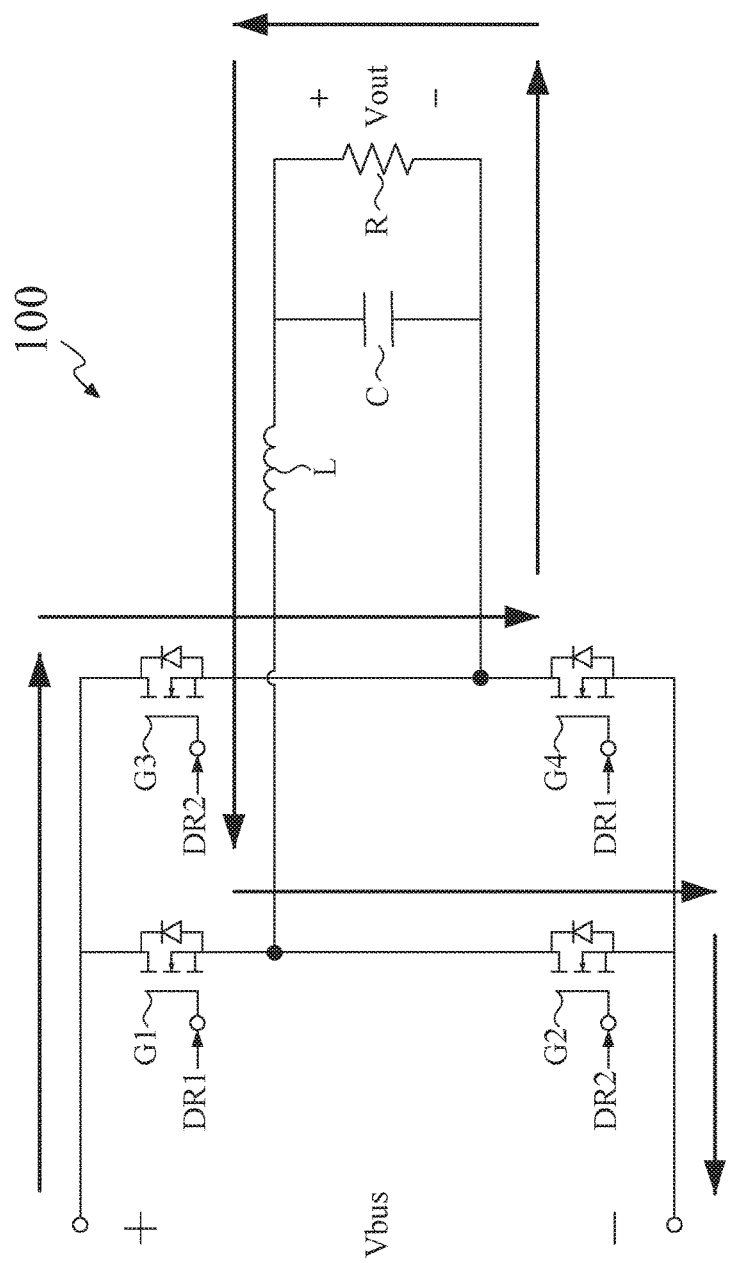
FIG. 6 illustrates the inverse operation of the inverter circuit of the first embodiment of the present invention.

Please refer to FIGS. 2-6. FIG. 2 illustrates operational procedures of a first embodiment of the present invention, and FIGS. 4-6 illustrate the inverter circuit of the first embodiment of the present invention and the forward and inverse operations thereof respectively. As shown in FIG. 4, the first embodiment of the present invention employs a full-bridge inverter circuit 100 to modulate the AC waveform. The full-bridge inverter circuit 100 is single phase operation. The circuit structure of the full-bridge inverter circuit 100 mainly includes a first switch G1, a second switch G2, a third switch G3 and a fourth switch G4 of four MOSFETs and a first-order filter composed of an inductor L, a capacitor C and a resistor R. In the first embodiment of the present invention, the first switch G1 and the fourth switch G4 are employed to receive modulation driving signals DR1 while the second switch G2 and the third switch G3 are utilized to receive modulation driving signals DR2. That is to say, the two groups of switches are turned ON or turned OFF according to respective timings respectively, and the timings which the two groups of switches follow respectively are identical but whether the switches are turned ON or not is staggered to each other.

As shown in FIGS. 2, 3, 5 and 6, in the first embodiment of the present invention, the first switch G1 and the fourth switch G4 are turned ON or turned OFF according to the modulation driving signals DR1 simultaneously while the second switch G2 and the third switch G3 are turned ON or turned OFF according to the modulation driving signals DR2 at the same time. Therefore, as shown in step S101, during the middle time period Tc, the first switch G1 and the fourth switch G4 are turned ON, and the second switch G2 and the third switch G3 are turned OFF. At this time, the duty ratio is 100%, i.e. the first switch G1 and the fourth switch G4 are turned ON completely. If the inputted voltage Vbus is 170V at this time, the output voltage Vout of the AC output waveform is 170V*100%=170V.

As shown in step S102, during the latter time period Tb, the first switch G1 and the fourth switch G4 are turned ON while the second switch G2 and the third switch G3 are turned OFF. The duty ratio is 75% at this time, i.e. the first switch G1 and the fourth switch G4 are partially turned ON. If the inputted voltage Vbus is 170V at this time, the output voltage Vout of the AC output waveform is 170V*75%=127.5V. Furthermore, as shown in step S103, during the former time period Tf, the first switch G1 and the fourth switch G4 are turned OFF while the second switch G2 and the third switch G3 are turned ON. The duty ratio is 75% at this time. That is to say, the second switch G2 and the third switch G3 are partially turned ON. If the inputted voltage Vbus is 170V at this time, the output voltage Vout of the AC output waveform is 170V*75%*(−1)=−127.5V.

Finally, as shown in step S104, during the middle time period Tc, the first switch G1 and the fourth switch G4 are turned OFF while the second switch G2 and the third switch G3 are turned ON. The duty ratio is 100% at this time, i.e. the second switch G2 and the third switch G3 are turned ON completely. If the inputted voltage Vbus is 170V at this time, the output voltage Vout of the AC output waveform is 170V*100%*(−1)=−170V. After the inputted voltage Vbus is inputted into the inverter circuit 100 via repeating the four steps mentioned above, the inverter circuit 100 is further controlled by the microprocessor, so as to generate the output voltage Vout presenting the stepping AC waveform.

Figure 7:
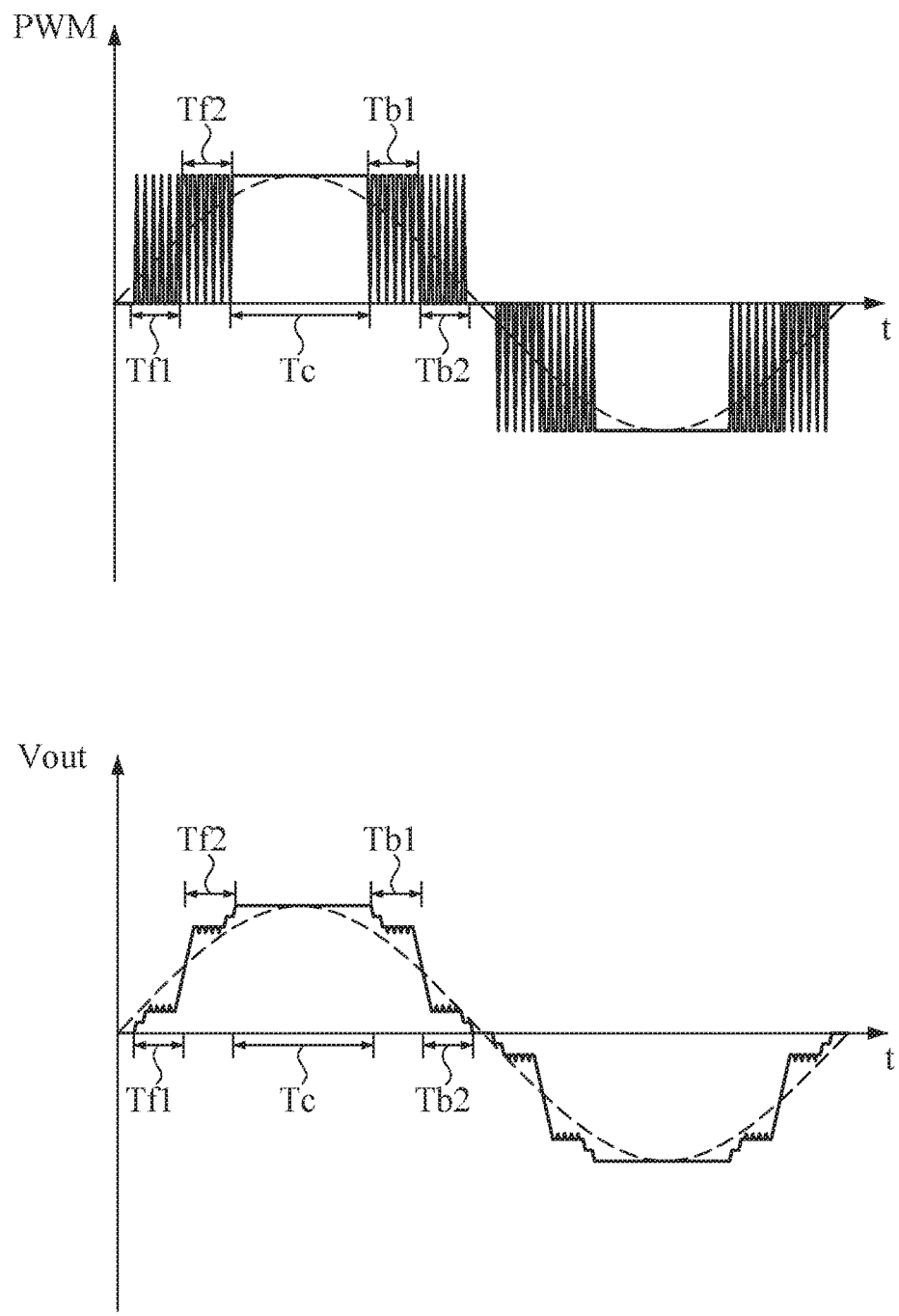
FIG. 7 illustrates modulation signals and AC output waveforms of a second embodiment of the present invention.

Please refer to FIG. 7 again, which illustrates modulation signals and AC output waveforms of a second embodiment of the present invention. As shown in FIG. 7, the modulation signal of the second embodiment of the present invention is a pulse width modulation PWM signal shown in the upper diagram. The pulse width modulation (PWM) signal belongs to modulation signals via the double polar modulation method. The pulse width modulation PWM signals themselves have positive and negative half cycles, and thus can generate the AC output waveform having positive and negative values switching in a cycle.

In the second embodiment of the present invention, any half cycle of the pulse width modulation signal is a first former time period Tf1, a second former time period Tf2, a middle time period Tc, a first latter time period Tb1 and a second latter time period Tb2 in sequence, which are configured according to an AC waveform to be modulated. Similar to the first embodiment of the present invention, the middle time period Tc corresponds to the peak segment of the AC waveform, and the first former time period Tf1 and the second former time period Tf2 correspond to the rise segment of the AC waveform. The first latter time period Tb1 and the second latter time period Tb2 correspond to the decline segment of the AC waveform. It should be noted that although the AC waveform and the pulse width modulation PWM signals all have positive and negative half cycles, the configuration of the five time periods may be applied similarly. In other words, it may be applied that at negative half cycle, the first former time period Tf1 and the second former time period Tf2 corresponding to the rise segment of the AC waveform are toward the negative direction while the first latter time period Tb1 and the second latter time period Tb2 corresponding to the decline segment of the AC waveform are toward the positive direction.

Preferably, in the second embodiment of the present invention, the first former time period Tf1 is equal to the second former time period Tf2, the first latter time period Tb1 and the second latter time period Tb2. The middle time period Tc is 4~10 times the first former time period Tf1, the second former time period Tf2, the first latter time period Tb1 or the second latter time period Tb2. However, the first former time period Tf1 may also be greater than the second former time period Tf2, and the first latter time period Tb1 may also be smaller than the second latter time period Tb2. The second embodiment of the present invention is not limited thereto. The peak segment of the AC output waveform will have enough dwell time because the middle time period Tc is 4~10 times the first former time period Tf1, the second former time period Tf2, the first latter time period Tb1 or the second latter time period Tb2. In the same way, there will be enough switch time between the positive peak segment and the negative peak segment of the AC output waveform (i.e. having longer dwell time at zero potential) or the AC output waveform will have smoother zero-crossing point at this time period so as to be easily detected (but the detection of the peak segment is not affected) because the first former time period Tf1, the second former time period Tf2 and the first latter time period Tb1, the second latter time period Tb2 are configured before and after the middle time period Tc respectively, and the middle time period Tc is 4~10 times the first former time period Tf1, the second former time period Tf2, the first latter time period Tb1 or the second latter time period Tb2.

In the second embodiment of the present invention, a duty ratio modulated driving signal is generated during the first former time period Tf1, the second former time period Tf2, the first latter time period Tb1 and the second latter time period Tb2 according to a first former duty ratio, a second former duty ratio, a first latter duty ratio and a second latter duty ratio respectively to modulate the AC waveform and generate a stepping AC waveform converted from the AC waveform, i.e. the AC output waveform. In the second embodiment of the present invention, the first former duty ratio, the second former duty ratio, the first latter duty ratio and the second latter duty ratio correspondingly modulate the AC waveforms during the first former time period Tf1, the second former time period Tf2, the first latter time period Tb1 and the second latter time period Tb2 respectively. Preferably, in the second embodiment of the present invention, the first former duty ratio, the second former duty ratio, the middle duty ratio, the first latter duty ratio and the second latter duty ratio are about 20%~30%, about 70%~80%, about 100%, about 70%~80% and about 20%~30% of the inputted voltage respectively. More preferably, it is more desirable that the first former duty ratio and the second latter duty ratio are closer to 20% and the second former duty ratio and the first latter duty ratio are closer to 80% because the switching between the positive and negative peak segments may be further smoothed and the detection of the zero potential is advantaged.

The foregoing description is a preferred embodiment of the present invention. It should be appreciated that this embodiment is described for purposes of illustration only, not for limiting, and that numerous alterations and modifications may be practiced by those skilled in the art without departing from the spirit and scope of the present invention. It is intended that all such modifications and alterations are included insofar as they come within the scope of the present invention as claimed or the equivalents thereof.

References throughout the specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments. Without departing from the scope of the present invention, the specification may be amended and the amendment may be supported by the detailed description mentioned above. The present invention is not limited to the drawings and detailed description disclosed in the specification. The specification and the drawings is for illustrating the present invention, not for limiting the present invention.

Based on the aforementioned, the present invention provides a modulation method for the AC waveform of the inverter. The generated AC output waveforms have longer dwell times at zero potential. The modulation process does not need expensive low frequency transformer and only requires a simple microprocessor, such that the AC electric tool may be activated more efficiently. Besides, no matter the modulation method for the AC waveform of the inverter provided by the present invention is performed in the first embodiment or the second embodiment, it is adapted to input the stepping AC waveform into an AC electric tool. The modulation method for the AC waveform of the inverter provided by the present invention is simpler than modulating the true sine wave. In connection with the open-loop operation in FIGS. 5 and 6, high-order selection is actually not necessary for selection of the microprocessor, such that the modulation method for the AC waveform of the inverter provided by the present invention indeed has the advantage in cost aspect in actual applications.

The present invention actually is novel, non-obvious and useful, and should meet the requirements of 35 U.S.C. The applicant files a new patent application in accordance with the requirements of 35 U.S.C. A Notice of Allowance is, therefore, respectfully requested.

What is claimed is:

1. A modulation method for AC waveform of an inverter, comprising the following steps:
generating an AC waveform including a former time period, a middle time period and a latter time period, wherein said middle time period corresponds to a peak segment of said AC waveform, said former time period and said latter time period corresponding to a rise segment and a decline segment of said AC waveform respectively, wherein said rise segment and said decline segment include two-stage step waveforms respectively; and
during said former time period, said middle time period and said latter time period, a duty ratio modulated driving signal is generated according to a former duty ratio, a middle duty ratio and a latter duty ratio respectively, wherein said former duty ratio and said latter duty ratio are about 25%~75% of an inputted voltage, respectively.

2. The method of claim 1, wherein said former time period is equal to said latter time period.

3. The method of claim 2, wherein said middle time period being 2~5 times said former time period or said latter time period.

4. The method of claim 1, wherein said former time period is greater or smaller than said latter time period.

5. The method of claim 4, wherein said middle time period being 2~5 times said former time period or said latter time period.

6. The method of claim 1, wherein said middle duty ratio is about 100% of said inputted voltage.

7. The method of claim 1, wherein said former time period is further classified into a first former time period and a second former time period in sequence, said latter time period being further classified into a first latter time period and a second latter time period in sequence.

8. The method of claim 7, wherein during said first former time period, said second former time period, said first latter time period and said second latter time period, said duty ratio modulated driving signal is generated according to a first former duty ratio, a second former duty ratio, a first latter duty ratio and a second latter duty ratio to modulate said AC waveform and generate a stepping AC waveform converted from said AC waveform.

9. The method of claim 8, wherein said first former duty ratio, said second former duty ratio, said middle duty ratio, said first latter duty ratio and said second latter duty ratio are about 20%~30%, about 70%~80%, about 100%, about 70%~80% and about 20%~30% of said inputted voltage, respectively.

10. The method of claim 8, wherein said stepping AC waveform is inputted into an AC electric tool.

11. The method of claim 8, wherein said first former duty ratio, said second former duty ratio, said first latter duty ratio and said second latter duty ratio correspondingly modulate said AC waveform in said first former time period, said second former time period, said first latter time period and said second latter time period respectively.

12. The method of claim 7, wherein said first former time period is equal to said second former time period, said first latter time period and said second latter time period.

13. The method of claim 12, wherein said middle time period is 4~10 times said first former time period, said second former time period, said first latter time period or said second latter time period.

14. The method of claim 7, wherein said first former time period is greater than said second former time period, and said first latter time period is smaller than said second latter time period.

15. The method of claim 14, wherein said middle time period is 4~10 times said first former time period, said second former time period, said first latter time period or said second latter time period.

* * * * *